United States Patent
Leung et al.

(10) Patent No.: US 8,254,243 B2
(45) Date of Patent: Aug. 28, 2012

(54) METHOD AND APPLICATION FOR GENERATING INTERLEAVER OR DE-INTERLEAVER

(75) Inventors: Raymond W. K. Leung, Shenzhen (CN); Dongyu Geng, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 827 days.

(21) Appl. No.: 12/268,867

(22) Filed: Nov. 11, 2008

(65) Prior Publication Data

US 2009/0132872 A1      May 21, 2009

Related U.S. Application Data

(63) Continuation of application No. PCT/CN2007/001442, filed on Apr. 28, 2007.

(30) Foreign Application Priority Data

May 12, 2006   (CN) .......................... 2006 1 0078576

(51) Int. Cl.
G06F 13/00 (2006.01)
(52) U.S. Cl. ........................ 370/203; 711/157
(58) Field of Classification Search .................. 370/203; 714/756, 701; 711/127, 157
See application file for complete search history.

(56) References Cited

U.S. PATENT DOCUMENTS

| | | | | |
|---|---|---|---|---|
| 6,161,209 | A * | 12/2000 | Moher | 714/780 |
| 2003/0072353 | A1 * | 4/2003 | Wengerter et al. | 375/146 |
| 2004/0199847 | A1 | 10/2004 | Calabro et al. | |
| 2005/0078764 | A1 | 4/2005 | Gresset et al. | |
| 2005/0152327 | A1 * | 7/2005 | Erlich et al. | 370/343 |

(Continued)

FOREIGN PATENT DOCUMENTS

EP       1 359 672 A1       5/2002

(Continued)

OTHER PUBLICATIONS $1^{st}$ Office Action in corresponding Chinese Application No. 200780016395.2 (Jun. 30, 2010).

(Continued)

*Primary Examiner* — Brian D Nguyen
(74) *Attorney, Agent, or Firm* — Leydig, Voit & Mayer, Ltd.

(57) ABSTRACT

A method and application for generating an interleaver or a de-interleaver are described. The method for generating interleaver includes: setting interleaving information of a base interleaver and/or de-interleaving information of a base de-interleaver, and respectively performing a cyclic shift transform on the interleaving information of the base interleaver so as to generate a plurality of different interleavers. Alternatively, the method for generating interleaver includes: deducing from the de-interleaving information to obtain the interleaving information of the base interleaver and performing the cyclic shift on the interleaving information obtained by deduction so as to generate a plurality of different interleavers. The method for realizing interleaving includes: inputting a data frame of each subscriber needed to be interleaved to the base interleaver and performing the cyclic shift on the data frame output by the base interleaver so as to realize interleaving, in which different subscribers correspond to different cyclic shifts. Alternatively, the method for realizing interleaving includes: performing the cyclic shift on the data frame of each subscriber to be interleaved and inputting the data frame after the cyclic shift to the base interleaver so as to realize interleaving, in which different subscribers correspond to different cyclic shifts.

9 Claims, 6 Drawing Sheets

U.S. PATENT DOCUMENTS

| | | | |
|---|---|---|---|
| 2005/0201477 A1 | 9/2005 | Cho et al. | |
| 2006/0156172 A1* | 7/2006 | Kim et al. | 714/755 |
| 2006/0291583 A1* | 12/2006 | Hammerschmidt et al. | 375/295 |
| 2007/0008946 A1* | 1/2007 | Kim | 370/345 |
| 2007/0067696 A1* | 3/2007 | Bhatt et al. | 714/758 |

FOREIGN PATENT DOCUMENTS

| | | |
|---|---|---|
| EP | 1 511 212 A1 | 8/2003 |
| EP | 1775840 A1 | 4/2007 |
| WO | WO 2005/088924 A1 | 9/2005 |

OTHER PUBLICATIONS

Written Opinion of the International Searching Authority in corresponding PCT Application No. PCT/CN2007/001442 (Aug. 9, 2007).

Ping et al., "A Simple Approach to Near-Optimal Multiuser Detection: Interleave-Division Multiple-Access," 2003, Institute of Electrical and Electronics Engineers, New York, New York.

Wu et al., "User-specific chip-level interleaver design for IDMA systems," Electronics Letters, Feb. 16, 2006, vol. 42, No. 4, Institute of Electrical and Electronics Engineers, New York, New York.

European Patent Office, European Search Report in European Patent Application No. 07721015.1 (May 7, 2012).

Kusume et al., "Cyclically Shifted Multiple Interleavers," Global Telecommunications Conference, Globecom 2006, IEEE, XP031075920, Munich, Germany (Nov. 1, 2006).

Wu et al., "User-Specific Chip-Level Interleaver Design for IDMA Systems," Electronics Letters, IEE Stevenage, GB, vol. 42, No. 4, XP006026209 (Feb. 16, 2006).

Kusume et al., "Some Aspects of Interleave Division Multiple Access in Ad Hoc Networks," Proc., $4^{th}$ International Symposium on Turbo Codes & Related Topics, Munich, Germany, XP002674364 (Apr. 3-7, 2006).

European Patent Office, Examination Report in European Application No. 07721015.1 (Jun. 12, 2012).

* cited by examiner

METHOD AND APPLICATION FOR GENERATING INTERLEAVER OR DE-INTERLEAVER

CROSS-REFERENCE TO RELATED APPLICATIONS

This application is a continuation of International Patent Application No. PCT/CN2007/001442, filed Apr. 28, 2007, which claims priority to Chinese Patent Application No. 200610078576.5, filed May 12, 2006, both of which are hereby incorporated by reference in their entirety.

FIELD OF THE TECHNOLOGY

The present invention relates to a communication technology field, and more particularly to a method and application for generating an interleaver or a de-interleaver.

BACKGROUND

An interleave-division multiple-access (IDMA) is a multiple-access manner adapted to differentiate different subscribers by using a chip-level interleaving method.

A key point of the FDMA technology is to assign different interleavers for the different subscribers. Recently, there are mainly two methods for designing the interleavers for the different subscribers in the IDMA system.

In a first method, the IDMA system requires that a spreading chip interleaver of each subscriber may be different, and thus one simplest and most direct method is to design a different chip interleaver for each subscriber, in which each interleaver is randomly generated.

In a technical solution of the first method, the interleaver may be separately designed for each subscriber. Further, in order to finish interleaving and de-interleaving processes of all the spreading chips of different subscribers, information of the interleaver and the de-interleaver of each subscriber may be stored in the system. When the lengths of the interleaver and the de-interleaver are relatively long, and the number of the subscribers is large, storage of the information of the interleavers and the de-interleavers of all the subscribers may occupy a large portion of memory space, thereby increasing complexity of the system.

In a second method, one interleaver $\pi$ and one de-interleaver $\pi^{-1}$ are designed for the system first, the interleaver and the de-interleaver of a first subscriber are respectively $\pi$ and $\pi^{-1}$, the interleaver and the de-interleaver of a second subscriber are respectively 2 series $\pi$ and 2 series $\pi^{-1}$, and so forth, the interleaver and the de-interleaver of a $k^{th}$ subscriber are respectively k series $\pi$ and k series $\pi^{-1}$. The interleaver and the de-interleaver of the $k^{th}$ subscriber are as shown in FIG. 1.

In the technical solution of the second method, only the information of the interleaver $\pi$ and the de-interleaver $\pi^{-1}$ may be stored in the system, so as to obtain the information of the interleavers and the de-interleavers of all the subscribers.

The technical solution of the second method solves a problem of the first technical solution that the storage of the information of the interleavers and the de-interleavers of all the subscribers occupies a large portion of the memory space. However, in this technical solution, a spreading code word of the $k^{th}$ subscriber needs to finish the interleaving process through k series interleavers, and similarly, a code word received by the receiving end also needs to finish the de-interleaving process through k series de-interleavers, so that a time delay resulted during the code word interleaving and de-interleaving processes is much large. Moreover, the larger the number of the series interleavers is, the larger the time delay may be. The design manner of the interleavers in the second method requires a relatively high information process capability of the system, thereby increasing the complexity of the system.

In wireless communication systems, the application of the interleavers and the de-interleavers are very broad. When a plurality of different interleavers and de-interleavers are required to be designed for a transmitting end and a receiving end in the wireless communication system, the method adopted is basically the same as the above-mentioned method, except that in the IDMA system, the different interleavers and de-interleavers are adapted to differentiate the subscribers, and in other systems, the interleavers and the de-interleavers may not be adapted to differentiate the subscribers. The methods for designing the interleavers and the de-interleavers arc substantially the same, so the disadvantages of the first method one or the second method still exist in other wireless communication systems.

SUMMARY

The present invention is directed to a method for generating an interleaver or a de-interleaver and an application thereof, which are capable of greatly simplifying a design process for the interleaver or the de-interleaver, saving storage space occupied by interleaving information and de-interleaving information, and effectively solving a time delay problem during interleaving and de-interleaving processes.

The present invention provides a method for generating interleaven

The method includes the following steps: getting interleaving information of a base interleaver and performing a cyclic shift on the interleaving information to generate a plurality of different interleavers; or getting de-interleaving information of a base de-interleaver and deducing from the de-interleaving information to obtain the interleaving information of the base interleaver and performing a cyclic shift on the interleaving information obtained by deduction to generate a plurality of different interleavers.

The present invention further provides a method for generating de-interleaver.

The method includes: getting de-interleaving information of a base de-interleaver and performing a cyclic shift corresponding to an interleaving information cyclic shift on the de-interleaving information so as to generate a plurality of different de-interleavers; or getting interleaving information of a base interleaver and deducing from the interleaving information to obtain the de-interleaving information of the base de-interleaver and performing a cyclic shift corresponding to an interleaving information cyclic shift on the de-interleaving information obtained by deduction so as to generate a plurality of different de-interleavers.

The present invention further provides a system for generating interleaver or de-interleaver, which includes a transmitting end device and a receiving end.

The transmitting end device includes a generating interleaver apparatus and the receiving end device includes a generating de-interleaver apparatus, or the receiving end device includes a generating de-interleaver apparatus and the generating interleaver apparatus.

The generating interleaver apparatus includes a first storage module and a generating interleaver module. The first storage module is adapted to store interleaving information of a base interleaven The generating interleaver module is adapted to obtain the interleaving information of the base interleaver from the first storage module and perform a cyclic shift on the interleaving information so as to generate a plurality of different interleavers.

The generating de-interleaver apparatus includes a second storage module and a generating de-interleaver module. The second storage module is adapted to store de-interleaving information of a base de-interleaver. The generating de-interleaver module is adapted to obtain the de-interleaving information of the base de-interleaver from the second storage module and perform the cyclic shift on the de-interleaving information so as to generate a plurality of different de-interleavers.

The present invention further provides a method for realizing interleaving.

The method includes performing a cyclic shift on interleaving information of a base interleaver to generate an interleaver for each subscriber, wherein different subscribers have different interleavers; and inputting a data frame of each subscriber needed to be interleaved to corresponding interleaver to realize interleaving; wherein the interleaving information of the base interleaver is preset interleaving information of the base interleaver or the interleaving information of the base interleaver obtained by deduction according to preset de-interleaving information of a base de-interleaver.

The present invention further provides a network device, which is a transmitting end device, and includes a generating interleaver apparatus and an interleaving module.

The generating interleaver apparatus includes a first storage module, a generating interleaver module and an interleaving module. The first storage module is adapted to store interleaving information of a base interleaver The generating interleaver module is adapted to obtain the interleaving information of the base interleaver from the first storage module and perform a cyclic shift on the interleaving information to generate an interleaver for each subscriber, wherein different subscribers have different interleavers. The interleaving module is adapted to input a data frame of each subscriber needed to be interleaved to corresponding interleaver generated by the generating interleaver module to realize interleaving.

The present invention further provides a method for realizing de-interleaving.

The method includes performing a cyclic shift on de-interleaving information of a base de-interleaver to generate a de-interleaver for each subscriber, wherein different subscribers have different de-interleavers; and inputting an data frame interleaved by each subscriber to corresponding de-interleaver to realize de-interleaving; wherein the de-interleaving information of the base de-interleaver is preset de-interleaving information of the base de-interleaver or the de-interleaving information of the base de-interleaver obtained by deduction according to preset interleaving information of a base interleaven The present invention further provides a network device, which is a receiving end device, and includes a generating de-interleaver apparatus and a de-interleaving module, or a generating interleaver apparatus, an interleaving module, a generating de-interleaver apparatus and a de-interleaving module.

The generating interleaver apparatus includes a first storage module, a generating interleaver module and an interleaving module. The first storage module is adapted to store interleaving information of a base interleaver. The generating interleaver module is adapted to obtain the interleaving information of the base interleaver from the first storage module and perform a cyclic shift on the interleaving information to generate an interleaver for each subscriber, wherein different subscribers have different interleavers. The interleaving module is adapted to input a data frame needed to be interleaved to corresponding interleaver generated by the generating interleaver module to realize interleaving.

The generating interleaver apparatus includes a second storage module, a generating de-interleaver module and a de-interleaving module. The second storage module is adapted to store de-interleaving information of a base de-interleaver. The generating de-interleaver module is adapted to obtain the de-interleaving information of the base de-interleaver from the second storage module and perform the cyclic shift on the de-interleaving information to generate a de-interleaver for each subscriber, wherein different subscribers have different de-interleavers. The de-interleaving module is adapted to input a data frame needed to be interleaved to corresponding de-interleaver so as to realize interleaving.

The present invention further provides a method for realizing interleaving.

The method includes inputting a data frame of each subscriber needed to be interleaved to a base interleaver and performing a cyclic shift on the data frame output by the base interleaver so as to realize interleaving, wherein different subscribers correspond to different cyclic shifts.

Alternatively, the method includes performing a cyclic shift on a data frame of each subscriber needed to be interleaved and inputting the data frame after the cyclic shift to a base interleaver so as to realize interleaving, wherein different subscribers correspond to different cyclic shifts.

The present invention further provides a network device, which is a transmitting end device, and includes a base interleaver and a first shifting module.

A data frame of each subscriber needed to be interleaved is input to the base interleaver, the base interleaver performs an interleaving process on the input data frame, the data frame after the interleaving process is input to the first shifting module and the first shifting module performs a cyclic shift on the received data frame and outputs the data frame, wherein different subscribers correspond to different cyclic shifts.

Alternatively, the first shifting module performs a cyclic shift on a data frame of each subscriber needed to be interleaved and inputs the interleaved data frame to the base interleaver, the base interleaver performs an interleaving process on the input data frame and outputs the interleaved data frame, wherein different subscribers correspond to different cyclic shifts. Different subscribers correspond to different cyclic shifts.

The present invention further provides a method for realizing de-interleaving.

The method includes performing a cyclic shift on a data frame interleaved by each subscriber, inputting the data frame after the cyclic shift to a base de-interleaver and outputting, by the base de-interleaver, the data frame to realize de-interleaving, wherein different subscribers correspond to different cyclic shifts.

Alternatively, the method includes inputting a data frame interleaved by each subscriber to a base de-interleaver and performing a cyclic shift on the data frame output by the base de-interleaver to realize de-interleaving, wherein different subscribers correspond to different cyclic shifts.

The present invention further provides a network device, which is a receiving end device, and includes a base de-interleaver and a second shifting module, or includes a base interleaver, a first shifting module, a base de-interleaver, and a second shifting module.

The base interleaver, the first shifting module, the base de-interleaver, and the second shifting module of the receiving end device perform the operations as follows.

A data frame of each subscriber needed to be interleaved is input to the base interleaver, the base interleaver performs an interleaving process on the input data frame and inputs the data frame after the interleaving process to the first shifting module, and the first shifting module performs a cyclic shift on the received data frame and outputs the data frame, in which different subscribers correspond to the different cyclic shifts.

The second shifting module performs the cyclic shift on the data frame to be de-interleaved of each subscriber and transmits the data frame after the cyclic shift to the base de-interleaver, the base de-interleaver performs a de-interleaving process on the received data frame and outputs the data frame, in which different subscribers correspond to the different cyclic shifts.

Alternatively, the base interleaver, the first shifting module, the base de-interleaver, and the second shifting module of the receiving end device perform the operations as follows.

The first shifting module performs a cyclic shift on a data frame to be interleaved of each subscriber and inputs the data frame to the base interleaver, the base interleaver performs an interleaving process on the input data frame and outputs the interleaved data frame.

The base de-interleaver performs a de-interleaving process on the data frame corresponding to each subscriber needed to be de-interleaved and transmits the de-interleaved data frame to the second shifting module, the second shifting module performs the cyclic shift on the received data frame and outputs the data frame, in which different subscribers correspond to different cyclic shifts.

It may be known from the above technical solutions that in the present invention, the base interleaver and the base de-interleaver are used, and the simple cyclic shift transform is respectively performed on the base interleaver and the base de-interleaver, so as to generate other interleavers and de-interleavers for the system. In the present invention, only the base interleaver and the base de-interleaver are required, so it is only necessary for the system to store the interleaving information of the base interleaver and the de-interleaving information of the base de-interleaver, thus saving a great amount of memory resource as compared with the solution one of the prior art. In the present invention, the methods for generating the interleaver and the de-interleaver for the system are quite simple, which reduces the system complexity and prevents the time delay during the interleaving and the de-interleaving processes as compared with the solution two of the prior art. When a wireless communication system performs the interleaving and the de-interleaving processes by adopting the interleaver and the de-interleaver designed according to the present invention, system performances, such as bit error, may achieve the system performance in the solution of the prior art. In the present invention, not only the interleaving and the de-interleaving processes may be realized by performing the cyclic shift on the base interleaver and the base de-interleaver, but also the interleaving process may be realized by performing the cyclic shift on the data frame input to the base interleaver and using the base interleave, the de-intereleving process may be realized by performing the cyclic shift on the data frame output from the base de-interleaver, so that the realizing process is quite flexible. The technical solution provided in the embodiments of the present invention may be applicable to various wireless communication systems requiring the interleaving and the de-interleaving processes, such as IDMA, thereby saving the system resource and preventing the time delay during the interleaving and the de-interleaving processes.

DETAILED DESCRIPTION

Figure 1:
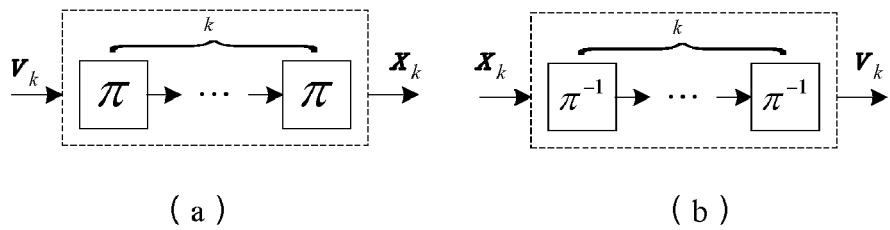
FIG. 1 is an interleaver and a de-interleaver of a $k^{th}$ subscriber.

In a recent design solution of an intreleaver in an IDMA system, if one interleaver and one de-interleaver are designed for each subscriber, interleaving information of the interleavers and de-interleaving information of the de-interleavers of all the subscribers may be stored, so that a great amount of the interleaving information and the de-interleaving information may occupy a large portion of storage space. If the different numbers of interleavers with the same form are serially connected to solve the storage space problem, the interleaving and the de-interleaving processes may become relatively complicated and have a large calculation amount, and the problem of time delay during the interleaving and the de-interleaving processes is serious. The embodiment of the present invention provides a novel, simple and easily-realized method for designing the interleaver and the de-interleaver to solve the problems in the prior art.

In the embodiment of the present invention, firstly one interleaver is required, and the interleaver may be called as a base interleaver. Other interleavers in the wireless communication system are generated by the base interleaver, for example, the interleavers of all the subscribers in the IDMA system are generated based on the base interleaver That is to say, by performing a cyclic shift on the base interleaver, the embodiment of the present invention makes the interleavers in the wireless communication system different from each other, for example, making the interleavers of the subscribers in the IDMA system different from each other, thereby differentiating the different subscribers.

The de-interleaver corresponding to the above base interleaver is called as a base de-interleaver. Other de-interleavers in the wireless communication system are generated by the base de-interleaver. That is to say, by performing the cyclic shift on the base de-interleaver, the embodiment of the present invention makes the de-interleavers in the wireless communication system different from each other, for example, the de-interleavers of all the subscribers in the IDMA system are generated based on the base de-interleaver performing the simple cyclic shift transform. By performing the cyclic shift on the de-interleaving information of the base de-interleaver, the embodiment of the present invention may make the de-interleavers of the subscribers in the IDMA system different from each other.

In the present invention, only the base interleaver and the base de-interleaver are required to be preset, so in the wireless communication system, for example, the IDMA system, only the interleaving information of the base interleaver and the de-interleaving information of the base de-interleaver are required to be stored. Here, the interleaving information of the base interleaver is usually a vector $\pi$ of the base interleaver, and may also be a matrix of the base interleaver. The storage space occupied by the matrix of the base interleaver is larger than the vector $\pi$ of the base interleaver. Correspondingly, the de-interleaving information of the base de-interleaver is usually the vector $\pi^{-1}$ of the base de-interleaver, and may also be the matrix of the base de-interleaver. Similarly, the storage space occupied by the matrix of the base de-interleaver is larger than the vector $\pi^{-1}$ of the base de-interleaver.

As there is a certain relationship between the base interleaver and the base de-interleaver, once one of the two is known, another may be obtained, so only the interleaving information of the base interleaver or the de-interleaving information of the base de-interleaver may be stored in a receiving end. In a detailed application process, the receiving end may deduce the de-interleaving information of the base de-interleaver according to the stored interleaving information of the base interleaver, or deduce the interleaving information of the base interleaver according to the stored de-interleaving information of the base de-interleaver.

It may be known from the above description that in the embodiment of the present invention, the method and the process for generating each interleaver according to the base interleaver are quite simple. In the IDMA system, the method and the generating process for generating the interleaver of each subscriber are quite simple, so when the transmitting end in the IDMA system interleaves a data frame of the subscriber, for example, a spreaded chip according to the interleaver of the subscriber, the time delay generated during the interleaving process in the prior art two is avoided. Further, in the IDMA system, only the interleaving information of the base interleaver and the de-interleaving information of the base de-interleaver are required to be stored, thereby saving a great amount of the storage space in the system.

In order to give a further description of the technical solution of the present invention, the recent interleaving and de-interleaving processes are simply introduced as follows.

Figure 2:
FIG. 2 is a schematic view of operation principles of the interleaver and the de-interleaver.

Operation principles of the interleaver and the de-interleaver are shown in FIG. 2.

In FIG. 2, v is the data frame before being interleaved, x is the data frame after being interleaved, a length of a chip is set to L, in which $V=(v_0, v_1, \ldots, v_{L-1})$, $x=(x_0, x_1, \ldots, x_{L-1})$ and v and x are defined row vectors.

The interleaver is set to be represented as $\pi$, the de-interleaver is represented by $\pi^{-1}$, and a size of the interleaver is an integer L. Here, the interleaving information of the interleaver $\pi$ is represented as $\pi(0), \pi(1), \ldots, \pi(L-1)$, and $\pi$ is a defined row vector.

$x_i=v_{\pi(i)}$ is given, in (a) of FIG. 2, $\pi(i)=j$ and $(i=0,1,\ldots L-1; j=0,1,\ldots L-1)$. $X_i=v_{\pi(i)}$ represents that the data frame $v_j$ before being interleaved is changed to the data frame $x_i$ after being interleaved.

Similarly, the de-interleaving information of the de-interleaver $\pi^{-1}$ is represented as $\pi^{-1}(0), \pi^{-1}(1), \ldots \pi^{-1}(L-1)$. $v_j=x_\pi^{-1}(j)$ is given, in (b) of FIG. 2, $\pi^{-1}(j)=i$ and $(i=0,1,\ldots L-1; j=0,1,\ldots L-1)$, and $v_j=X_\pi^{-1}(j)$ represents that the interleaved data frame $x_i$ returns to $v_j$ after being de-interleaved.

The relationship between v and x may be represented as the interleaving matrix P or the de-interleaving matrix $P^{-1}$. Both P and $P^{-1}$ are (0, 1) matrixes in a form of L×L. In the matrix, there is only one "1" in each row and each column, and the remaining positions are "0", so as long as the position of "1" in the matrix P and the matrix $P^{-1}$ is determined, the matrix P and the matrix $P^{-1}$ are obtained.

The method for determining the interleaving matrix P through the interleaver vector $\pi$ is described as follows.

The interleaver is set as known, and the form of the interleaver is $\pi(i)=j$, and $(i=0,1,\ldots L-1; j=0,1,\ldots L-1)$, it may be known that a $j+1^{th}$ element in an $i+1^{th}$ row of P is "1", then the position of "1" of each row is written one by one, thereby obtaining the interleaving matrix P.

The method for determining the de-interleaving matrix $P^{-1}$ through the de-interleaver vector $\pi^{-1}$ is described as follows.

The de-interleaver is set as known, and the form of the de-interleaver is $\pi^{-1}(j)=i$, and $(i=0,1,\ldots L-1; j=0,1,\ldots L-1)$, it may be known that an $i+1^{th}$ element in an $j+1^{th}$ row of the de-interleaving matrix $P^{-1}$ is "1", then the position of "1" of each row is written one by one, thereby obtaining the de-interleaving matrix $P^{-1}$.

On the contrary, if the interleaving matrix P and the de-interleaving matrix $P^{-1}$ are known, the interleaver $\pi$ and the de-interleaver $\pi^{-1}$ may be deduced as well.

The process of interleaving the data frame may be represented as $$X^T=Pv^T \quad (1)$$

The process of de-interleaving the data frame may be represented as $$V^T=P^{-1}X^T \quad (2)$$

In the following description of the embodiment of the present invention, if a specific description is not given, all the superscripts T represent as a transposition operation, and all the superscripts "−1" represent as an inversion operation.

It is proved that the interleaving matrix P has properties as follows.

$$P^{-1}=P^T$$

$$PP^T=P^TP=I \quad (3)$$

According to the properties of the interleaving matrix P, formula (1) and formula (2) are processed to obtain another mathematics expression manner of the interleaving and the de-interleaving processes, shown in formula (4) and formula (5).

$$X=(X^T)^T=(Pv^T)^T=vP^{-1} \quad (4)$$

$$V=(V^T)^T=(P^TX^T)^T=xP \quad (5)$$

It may be known from the formula (4) and the formula (5) that the interleaving process may be represented by the de-interleaving matrix, and the de-interleaving process may be represented by the interleaving matrix.

To understand the above description conveniently, a detailed example is given as follows.

Figure 3:
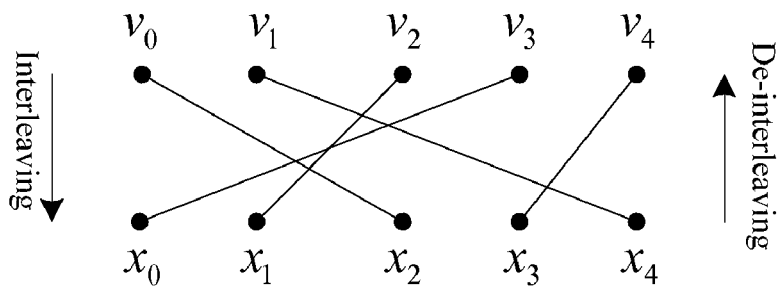
FIG. 3 is a corresponding relationship between a data frame before being interleaved and a data frame after being interleaved according to an embodiment of the present invention.

The length L of the interleaver π is set to 5, and the corresponding relationship between the data frame before being interleaved and the data frame after being interleaved is shown in FIG. 3.

In FIG. 3, after the data frame v before being interleavd is interleaved by the interleaver, the data frame x with a disturbed sequence is obtained. On the contrary, the data frame x may return to the data frame v before being interleaved through the de-interleaver.

During the practical realization, the corresponding interleaving relationship between the interleaver and the de-interleaver may be stored. For the interleaver, $\pi(0), \pi(1), \ldots \pi(L-1)$ may be stored, and for the de-interleaver, $\pi^{-1}(0), \pi^{-1}(1), \ldots \pi^{-1}(L-1)$ may be stored.

Therefore, for the interleaver, the relationship shown in formula (6) may be obviously obtained from FIG. 3.

$$X_0 = V_{\pi(0)}$$
$$X_1 = V_{\pi(1)}$$
$$X_2 = V_{\pi(2)}$$
$$X_3 = V_{\pi(3)}$$
$$X_4 = V_{\pi(4)} \quad (6a)$$

$$\pi(0) = 3$$
$$\pi(1) = 2$$
$$\pi(2) = 0$$

in which, $$\pi(4) = 1 \quad (6b)$$

Similarly, for the de-interleaver, the relationship shown in formula (7) may be obviously obtained from FIG. 3.

$$V_0 = X_{\pi^{-1}(0)}$$
$$V_1 = X_{\pi^{-1}(1)}$$
$$V_2 = X_{\pi^{-1}(2)}$$
$$V_3 = X_{\pi^{-1}(3)}$$
$$V_4 = X_{\pi^{-1}(4)} \quad (b\ 7a)$$

$$\pi^{-1}(0) = 2$$
$$\pi^{-1}(1) = 4$$
$$\pi^{-1}(2) = 1$$
$$\pi^{-1}(3) = 0$$

in which, $$\pi^{-1}(4) = 3 \quad (7b)$$

According to the corresponding relationship between P and $P^{-1}$ and the interleaver π and the de-interleaver $\pi^{-1}$, the formula (6) and the formula (7) may be represented as the interleaving matrix P and the de-interleaving matrix $P^{-1}$ which are shown as follows.

$$P = \begin{bmatrix} 0 & 0 & 0 & 1 & 0 \\ 0 & 0 & 1 & 0 & 0 \\ 1 & 0 & 0 & 0 & 0 \\ 0 & 0 & 0 & 0 & 1 \\ 0 & 1 & 0 & 0 & 0 \end{bmatrix} \quad P^{-1} = \begin{bmatrix} 0 & 0 & 1 & 0 & 0 \\ 0 & 0 & 0 & 0 & 1 \\ 0 & 1 & 0 & 0 & 0 \\ 1 & 0 & 0 & 0 & 0 \\ 0 & 0 & 0 & 1 & 0 \end{bmatrix}$$

According to formula (1), the interleaving process may be realized by the interleaving matrix shown in formula (8).

$$\begin{bmatrix} x_0 \\ x_1 \\ x_2 \\ x_3 \\ x_4 \end{bmatrix} = \begin{bmatrix} 0 & 0 & 0 & 1 & 0 \\ 0 & 0 & 1 & 0 & 0 \\ 1 & 0 & 0 & 0 & 0 \\ 0 & 0 & 0 & 0 & 1 \\ 0 & 1 & 0 & 0 & 0 \end{bmatrix} \begin{bmatrix} v_0 \\ v_1 \\ v_2 \\ v_3 \\ v_4 \end{bmatrix} \quad (8)$$

According to formula (4), the interleaving process may also be realized by the de-interleaving matrix, which may be quite easily deduced by those of ordinary skill in the art, so the detailed formula is not given in this embodiment.

Similarly, according to formula (2), the de-interleaving process may be realized by the de-interleaving matrix, as shown in formula (9).

$$\begin{bmatrix} v_0 \\ v_1 \\ v_2 \\ v_3 \\ v_4 \end{bmatrix} = \begin{bmatrix} 0 & 0 & 1 & 0 & 0 \\ 0 & 0 & 0 & 0 & 1 \\ 0 & 1 & 0 & 0 & 0 \\ 1 & 0 & 0 & 0 & 0 \\ 0 & 0 & 0 & 1 & 0 \end{bmatrix} \begin{bmatrix} x_0 \\ x_1 \\ x_2 \\ x_3 \\ x_4 \end{bmatrix} \quad (9)$$

Similarly, according to formula (5), the de-interleaving process may also be realized by the interleaving matrix, which may be quite easily deduced by those of ordinary skill in the art, so the detailed formula is not given in this embodiment.

After the interleaving and the de-interleaving processes are simply introduced, a detailed description of the technical solution of the present invention is given as follows, and the formulas mentioned above will be used during the description process.

In the embodiment of the present invention, according to the interleaving information of the base interleaver, the interleavers of all the subscribers in the IDMA system may be obtained by adopting the cyclic shift transform method, and according to the de-interleaving information of the base de-interleaver, the de-interleavers of all the subscribers may be obtained by adopting the cyclic shift transform method.

Before the description of the realizing process of the embodiment of the present invention, the form of the base interleaver is set as known, that is, the base interleaver is represented as π. Recently, there may be many manners for generating the base interleaver, and the detailed method for designing the base interleaver is not discussed here.

In the IDMA system, different interleavers are adapted to differentiate different subscribers, so in the embodiment of the present invention, the interleavers of the different subscribers may be obtained by performing a modulo operation on the base interleaver π, that is, the interleaver matrixes of the different subscribers may be obtained by performing the cyclic shift transform method on the base interleaver matrix. Here, the cyclic shift performed on the base interleaving matrix may be a row shift or a column shift, and may also be the row shift and the column shift at the same time. That is to say, in the embodiment of the present invention, when the interleavers of the different subscribers are generated according to the interleaving information of the base interleaver, the interleaver matrixes of the different subscribers may be generated by adopting the row shift manner for all the subscribers, or by adopting the column shift manner for all the subscribers, or by adopting the row shift manner and the column shift manner for all the subscribers. Further, the interleaver matrixes of the different subscribers may be generated by adopting the row shift manner for a portion of the subscribers and by adopting the column shift manner for a portion of the subscribers. Definitely, there are many methods for performing the shift on the matrix exist in the prior art, and in the embodiment of the present invention, any one of the shift methods of the matrix in the prior art may be performed on the interleaver matrix, which will not be repeated here.

The methods of the row cyclic shift and/or the column cyclic shift performed on the interleaving matrix and the de-interleaving matrix are equivalent to the modulo operation performed on the base interleaving vector and the base de-interleaving vector, that is, the modulo operation performed on the base interleaving vector and the base de-interleaving vector is substantially a kind of cyclic shift. In the description of the embodiment as follows, it is thoroughly proved that the same result may be obtained by adopting the two different manners through the detailed examples, so as to describe that the modulo operation performed on the base interleaving vector and the base de-interleaving vector is substantially a kind of cyclic shift.

The cyclic shift method is described as follows by taking the column cyclic shift performed on the base interleaving matrix for example. In order to differentiate the different subscribers by using the interleavers of the embodiment of the present invention, when the column shift or the row shift is adopted for all the subscribers in the system, a digit of the cyclic shift performed on the base interleaver for the different subscribers may be different.

For the $k^{th}$ subscriber, the digit of the cyclic shift performed on the base interleaving matrix is set to be represented as an integer $a_k$. In the DMA system, the digit $a_k$ of the cyclic shift corresponding to the $k^{th}$ subscriber may be determined by a plurality of manners, for example, as long as $a_k$ is any number being not smaller than 0 and $a_k$ of the different interleavers are different from results of performing modulo operation on L. Further, for example, an average assigning solution may be adopted, that is, the digits of the cyclic shifts for the different subscribers are obtained by averagely assigning the length of the interleaver according to the number of the subscribers, which is shown in formula (10).

$$a_k = \left\lfloor \frac{L}{K} \right\rfloor k \qquad (10)$$

L is the length of the base interleaver, and K is the number of the subscribers.

When determining the value of the digit $a_k$ of the cyclic shift corresponding to the $k^{th}$ subscriber in the system, any method is applicable as long as the digits of the cyclic shifts corresponding to the different subscribers are different.

Here, the interleaver and the de-interleaver of the $k^{th}$ subscriber are respectively represented as $\pi_k$ and $\pi_k^{-1}$. The interleaving form of the interleaver $\pi_k$ of the $k^{th}$ subscriber is represented as $\pi_k(0), \pi_k(1), \ldots \pi_k(L-1)$, and the de-interleaving form of the de-interleaver $\pi_k^{-1}$ of the $k^{th}$ subscriber is represented as $\pi_k^{-1}(0), \pi_k^{-1}(1), \ldots \pi_k^{-1}(L-1)$.

Figure 4:
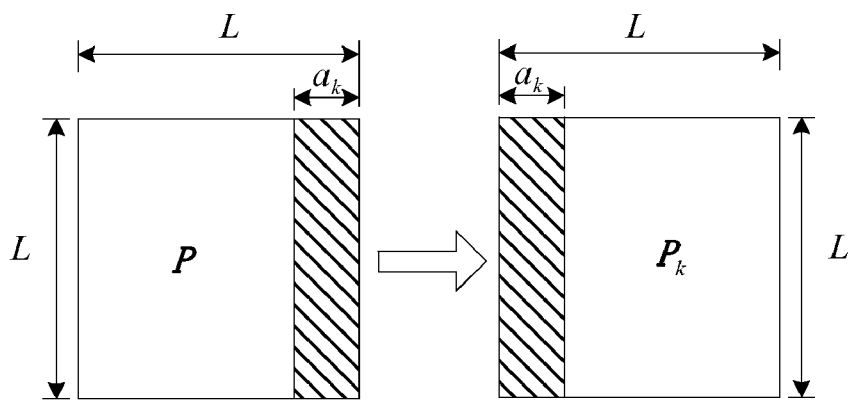
FIG. 4 is a schematic view of a cyclic shift transform of a base interleaving matrix according to the embodiment of the present invention.

The cyclic shift transform performed on the above base interleaving matrix is shown in FIG. 4.

In FIG. 4, the left block represents the base interleaving matrix P whose size is L×L, the shadowed part of the left block represents the last $a_k$ columns of the matrix. If the digit $a_k$ of the cyclic shift is determined, the last $a_k$ columns of the base interleaving matrix may be shifted to the front part of the matrix to become the first $a_k$ columns of the matrix, which is shown in the right block of FIG. 4. Thus the form of the interleaver of the $k^{th}$ subscriber may be obtained after obtaining the interleaving matrix $P_k$ corresponding to the $k^{th}$ subscriber interleaver. It may be obviously known from FIG. 4 that the interleaver of the $k^{th}$ subscriber is obtained by the base interleaver through performing the cyclic shift by the digit of $a_k$ on the base interleaving matrix.

When the base interleaver is described by using the vector π, in the embodiment of the present invention, the transform manner of the cyclic shift performed on the interleaving information of the base interleaver may be represented as the transform manner of the row cycle shift performed on the base interleaving matrix to obtain the interleaver of the $k^{th}$ subscriber in the IDMA system, or may also be represented as the transform manner of the column cyclic shift performed on the base interleaving matrix to obtain the interleaver of the $k^{th}$ subscriber in the IDMA system.

The detailed realizing process of obtaining the interleaver of the $k^{th}$ subscriber in the IDMA system by performing the row cyclic shift transform manner on the base interleaving matrix is described as follows.

The interleaver of the $k^{th}$ subscriber may be obtained by performing the row cyclic shift by the digit of $a_k$ on the base interleaving matrix, or by performing the modulo operation on the base interleaving vector, and the detailed row cyclic shift method is shown in formula (11a).

$$\pi_k(i) = \pi((i+a_k) \% L), i=0,1,\ldots,L-1 \qquad (11a)$$

Correspondingly, the de-interleaver of the $k^{th}$ subscriber may be obtained by formula (12a).

$$\pi_k^{-1}(i) = (\pi^{-1}(i) - a_k + L) \% L, i=0,1,\ldots,L-1 \qquad (12a)$$

% represents the modulo operation. If the specific description is not given, % in all the formulas in the embodiment of the present invention represents the modulo operation. In the formula (11a), $a_k$ is any number being not smaller than 0, and $a_k$ of different interleavers are different from the results of performing modulo operation on L.

The detailed realizing process of obtaining the interleaver of the $k^{th}$ subscriber in the IDMA system by performing the column cyclic shift transform manner on the base interleaving matrix is described as follows.

The interleaver of the $k^{th}$ subscriber may be obtained by performing the column cyclic shift by the digit of $a_k$ on the base interleaving matrix, or by performing the modulo operation on the base interleaving vector, and the detailed column cyclic shift method is shown in formula (11b).

$$\pi_k(i) = (\pi(i) + a_k) \% L, i=0,1,\ldots L-1 \qquad (11b)$$

Correspondingly, the de-interleaver of the $k^{th}$ subscriber may be obtained by formula (12b).

$$\pi_k^{-1}(i) = \begin{cases} \pi^{-1}(i-a_k), & i \geq a_k \\ \pi^{-1}((i+L-a_k)\% L), & i < a_k \end{cases} i=0,1,\ldots L-1 \qquad (12b)$$

$a_k$ is any number being not smaller than 0, and $a_k$ of different interleavers are different from the results of performing modulo operation on L.

In order to have a clearer description of the process and the steps of designing the interleaver of each subscriber in the embodiment of the present invention, a detailed designing example is given as follows.

The forms of the base interleaver and the corresponding base de-interleaver are set as shown in the formula (6) and the formula (7), and the digit of the cyclic shift performed on the $k^{th}$ subscriber is $a_k 1$.

In order to have a vivid understanding of the process of the cyclic shift performed on the base interleaving matrix, the process of obtaining the interleaver and the de-interleaver of the $k^{th}$ subscriber by performing the shift transform on the base interleaving matrix is described as follows.

For the $k^{th}$ subscriber, the shift transform performed on the base interleaving matrix is shown as follows.

$$P = \begin{bmatrix} 0 & 0 & 0 & 1 & 0 \\ 0 & 0 & 1 & 0 & 0 \\ 1 & 0 & 0 & 0 & 0 \\ 0 & 0 & 0 & 0 & 1 \\ 0 & 1 & 0 & 0 & 0 \end{bmatrix} \Longrightarrow P_k = \begin{bmatrix} 0 & 0 & 0 & 0 & 1 \\ 0 & 0 & 0 & 1 & 0 \\ 0 & 1 & 0 & 0 & 0 \\ 1 & 0 & 0 & 0 & 0 \\ 0 & 0 & 1 & 0 & 0 \end{bmatrix}$$

The above left matrix is the base interleaving matrix, the last column of the base interleaving matrix is shifted to be the first column to finish performing the cyclic shift by the digit of 1 on the base interleaving matrix, and the matrix is transformed to the right matrix after the cyclic shift. The right matrix is the interleaving matrix of the interleaver of the $k^{th}$ subscriber.

According to the formula (1), the interleaving process of the interleaver k may be obtained, as shown in formula(13).

$$\begin{bmatrix} x_{k,0} \\ x_{k,1} \\ x_{k,2} \\ x_{k,3} \\ x_{k,4} \end{bmatrix} = \begin{bmatrix} 0 & 0 & 0 & 0 & 1 \\ 0 & 0 & 0 & 1 & 0 \\ 0 & 1 & 0 & 0 & 0 \\ 1 & 0 & 0 & 0 & 0 \\ 0 & 0 & 1 & 0 & 0 \end{bmatrix} \begin{bmatrix} v_{k,0} \\ v_{k,1} \\ v_{k,2} \\ v_{k,3} \\ v_{k,4} \end{bmatrix} = \begin{bmatrix} v_{k,4} \\ v_{k,3} \\ v_{k,1} \\ v_{k,0} \\ v_{k,2} \end{bmatrix} \quad (13)$$

According to the corresponding relationship between the interleaving matrix and $\pi(0), \pi(1), \ldots, \pi(L-1)$, the interleaver of the $k^{th}$ subscriber may be easily obtained from the above transformed interleaving matrix $P_k$, and the form of the interleaver of the $k^{th}$ subscriber is: $\{\pi_k(0)=4, \pi_k(1)=3, \pi_k(2)=1, \pi_k(3)=0, \pi_k(4)=2\}$.

The de-interleaving matrix $P_k^{-1}$ may be obtained by performing the transposition operation on the interleaving matrix $P_k$.

$$P_k^{-1} = \begin{bmatrix} 0 & 0 & 0 & 1 & 0 \\ 0 & 0 & 1 & 0 & 0 \\ 0 & 0 & 0 & 0 & 1 \\ 0 & 1 & 0 & 0 & 0 \\ 1 & 0 & 0 & 0 & 0 \end{bmatrix} \quad (14)$$

Similarly, according to the corresponding relationship between the de-interleaving matrix and the $\pi^{-1}(0), \pi^{-1}(1), \ldots \pi^{-1}(L-1)$, the de-interleaver of the $k^{th}$ subscriber may be obtained, and the form of the de-interleaver of the $k^{th}$ subscriber is: $\{\pi_k^{-1}(0)=3, \pi_k^{-1}(1)=2, \pi_k^{-1}(2)=4, \pi_k^{-1}(3)=1, \pi_k^{-1}(4)=0\}$.

According to the formula (11b), the interleaver of the $k^{th}$ subscriber maybe obtained, as shown in formula (15).

$$\pi_k(0)=(\pi(0)+1) \% 5=(3+1) \% 5=4$$

$$\pi_k(1)=(\pi(1)+1) \% 5=(2+1) \% 5=3$$

$$\pi_k(2)=(\pi(2)+1) \% 5=(0+1) \% 5=1$$

$$\pi_k(3)=(\pi(3)+1) \% 5=(4+1) \% 5=0$$

$$\pi_k(4)=(\pi(4)+1) \% 5=(1+1) \% 5=2 \quad (15)$$

By comparing the formula (15) with the formula (13), it may be known that the interleaver of the $k^{th}$ subscriber obtained by performing the cyclic shift operation on the base interleaving matrix is the same as the interleaver of the $k^{th}$ subscriber obtained by performing the modulo operation on the base interleaving vector, so as to further prove that the modulo operation performed on the base interleaving vector is substantially a kind of cyclic shift.

According to the formula (12b), the de-interleaver of the $k^{th}$ subscriber may be obtained, which is shown in formula (16) as follows.

$$\pi_k^{-1}(0)=\pi^{-1}((0+5-1) \% 5)=\pi^{-1}(4)=3$$

$$\pi_k^{-1}(1)=\pi^{-1}((1+5-1) \% 5)=\pi^{-1}(0)=2$$

$$\pi_k^{-1}(2)=\pi^{-1}((2-1) \% 5)=\pi^{-1}(1)=4$$

$$\pi_k^{-1}(3)=\pi^{-1}((3-1) \% 5)=\pi^{-1}(2)=1$$

$$\pi_k^{-1}(4)=\pi^{-1}((4-1) \% 5)=\pi^{-1}(3)=0 \quad (16)$$

By comparing the formula (16) and the de-interleaver obtained by performing the cyclic shift operation on the base de-interleaving matrix, it may be known that the de-interleaver of the $k^{th}$ subscriber obtained by performing the cyclic shift operation on the base de-interleaving matrix is the same as the de-interleaver of the $k^{th}$ subscriber obtained by performing the modulo operation on the base de-interleaving vector, so as to further prove that the modulo operation performed on the base de-interleaving vector is substantially a kind of cyclic shift.

By using the method in the above description, the interleaver respectively corresponding to each subscriber in the system may be obtained through the cyclic shift transforms by the different digits performed on the base interleaving matrixes for the different subscribers. Similarly, the de-interleaver respectively corresponding to each subscriber in the system may be obtained through the cyclic shift transforms by the different digits performed on the base de-interleaving matrixes for the different subscribers.

In the above implementation, the data frame of the $k^{th}$ subscriber needed to be interleaved is interleaved through the interleaver $k^{th}$, and the interleaver k is obtained by performing the cyclic shift on the interleaving information of the base interleaver. The data frame of the $k^{th}$ subscriber needed to be de-interleaved is de-interleaved through the de-interleaver k, and the de-interleaver k is obtained by performing the cyclic shift on the de-interleaving information of the base de-interleaver.

Figure 5:
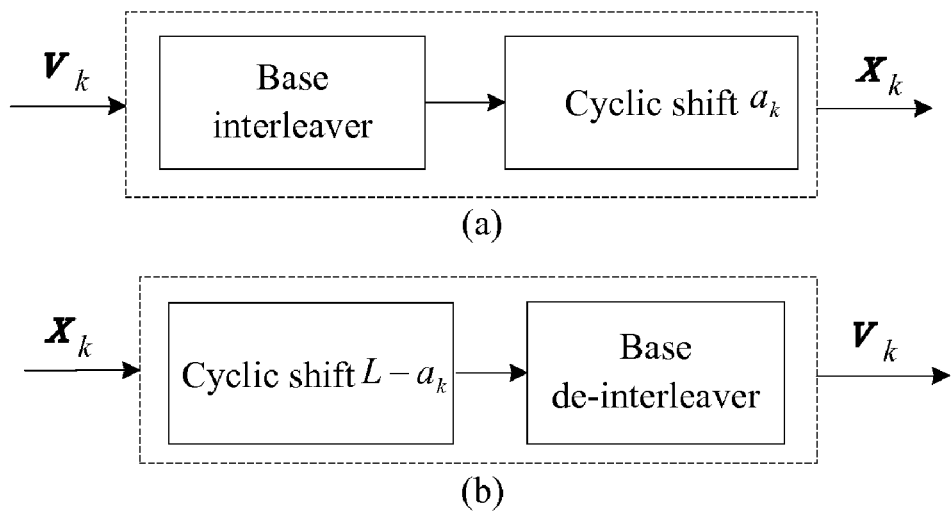
FIG. 5 is a first schematic view of an interleaving or de-interleaving process of an IDMA system according to the embodiment of the present invention.

The embodiment of the present invention further provides a technical solution for realizing interleaving and de-interleaving, which is shown in FIG. 5.

In FIG. 5(a), the transmitting end firstly interleaves the data frame needed to be interleaved by the base interleaver to obtain an interleaved chip, and then performs the cyclic shift by $a_k$ on the interleaved chip to finish the interleaving process of the data of the $k^{th}$ subscriber. That is to say, the realizing manner of FIG. 5(a) is equivalent to the transform manner performed on the base interleaver according to the formula 11(a). Relative to the interleaving method finished by interleaving the data frame output from the base interleaver and then performing the cyclic shift, the de-interleaving process of the receiving end is shown in FIG. 5(b).

In FIG. 5(b), the receiving end performs the cyclic shift by the digit of $L-a_k$ on the data frame interleaved by the $k^{th}$ subscriber, and then makes the chip after the cyclic shift through the base de-interleaver to finish the de-interleaving process of the data of the $k^{th}$ subscriber.

Figure 6:
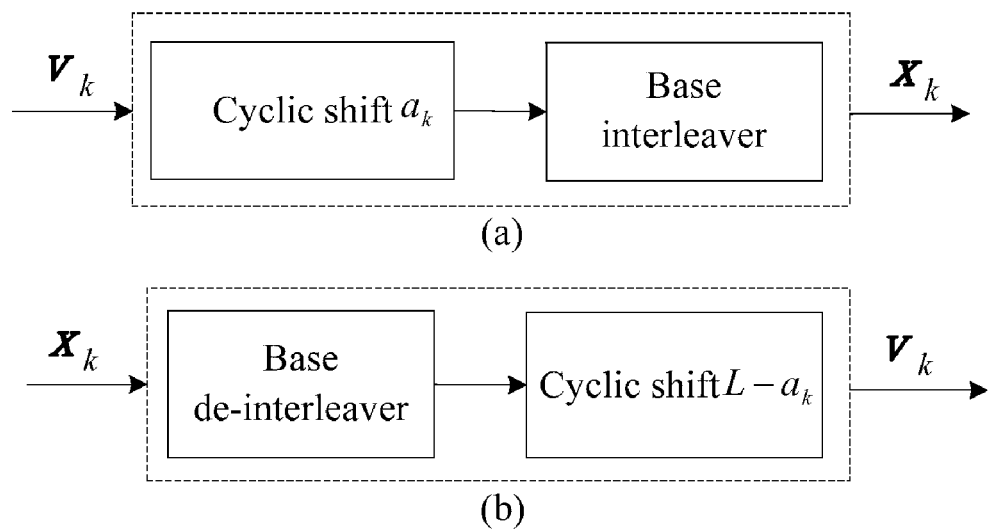
FIG. 6 is a second schematic view of the interleaving/de-interleaving process of the IDMA system according to the embodiment of the present invention.

The embodiment of the present invention further provides a technical solution for realizing interleaving and de-interleaving, which is shown in FIG. 6.

In FIG. 6(a), the transmitting end firstly performs the cyclic shift by as on the data frame needed to be interleaved, for example, the spread chip, and then makes the chip after the cyclic shift through the base interleaver to realize the interleaving process.

Whether the cyclic shift performed on the base interleaver, or the cyclic shift performed on the data frame needed to be input to the base interleaver, the obtained results are the same, and the two realizing manners are equivalent. That is to say, the realizing manner of FIG. 6(a) is equivalent to the transform manner performed on the base interleaver according to the formula 11(b).

In the embodiment as shown in FIG. 6, the base interleaver does not need any processing, it is only necessary to perform the cyclic shift on the data frame input to the base interleaver, not only the realizing process is quite simple, but also complexity of realizing the interleaving by the system is greatly reduced.

In the embodiment as shown in FIG. 6, in order to differentiate the different subscribers by using the interleavers, when the cyclic shift is performed on the data frame input to the base interleaver for different subscribers, the digits $a_k$ of the cyclic shifts may be different, $a_k$ is any number being not smaller than 0, and $a_k$ of different interleavers are different from the results of performing modulo operation on L. For example, $a_k$ of the $k^{th}$ subscriber may be $$a_k = \left\lfloor \frac{L}{K} \right\rfloor k,$$

in which L is the size of the base interleaver, and K is the number of the subscribers.

Relative to the above interleaving method finished by performing the cyclic shift on the data frame input to the base interleaver, the de-interleaving process of the receiving end is shown in FIG. 6(b).

In FIG. 6(b), $X_k$ is the interleaved data frame of the $k^{th}$ subscriber, $V_k$ is the de-interleaved data frame of the $k^{th}$ subscriber, and L is the same as the above content, which represents the size of the base de-interleaver. Firstly, the receiving end makes the received interleaved data frame $X_k$ through the base de-interleaver, and then performs the cyclic shift by the digit of $L-a_k$ on the data frame after being processed by the base de-interleaver, thereby realizing the de-interleaving $a_k$ is any number being not smaller than 0, and $a_k$ of different interleavers are different from the results of performing modulo operation on L. For example, $a_k$ of the $k^{th}$ subscriber may be $$a_k = \left\lfloor \frac{L}{K} \right\rfloor k,$$

in which L is the size of the base de-interleaver, and K is the number of the subscribers.

A detailed designing example is given as follows.

Being the same as the above method for performing the cyclic shift on the interleaving information of the base interleaver, it is set that the cyclic shift by the digit of 1 is performed on the data frame needed to be input to the base interleaver of the $k^{th}$ subscriber. Therefore, after being performed the cyclic shift by the digit of 1, the spread chip $V_k = \{v_{k,0}, v_{k,1}, v_{k,2}, v_{k,3}, v_{k,4}\}$ of $k^{th}$ subscriber becomes $v'_k = \{v_{k,1}, v_{k,2}, v_{k,3}, v_{k,4}, v_{k,0}\}$.

After being processed by the base interleaver, the data frame after the cyclic shift becomes $$\begin{bmatrix} x_{k,0} \\ x_{k,1} \\ x_{k,2} \\ x_{k,3} \\ x_{k,4} \end{bmatrix} = \begin{bmatrix} 0 & 0 & 0 & 1 & 0 \\ 0 & 0 & 1 & 0 & 0 \\ 1 & 0 & 0 & 0 & 0 \\ 0 & 0 & 0 & 0 & 1 \\ 0 & 1 & 0 & 0 & 0 \end{bmatrix} \begin{bmatrix} v_{k,1} \\ v_{k,2} \\ v_{k,3} \\ v_{k,4} \\ v_{k,0} \end{bmatrix} = \begin{bmatrix} v_{k,4} \\ v_{k,3} \\ v_{k,1} \\ v_{k,0} \\ v_{k,2} \end{bmatrix} \quad (17)$$

Compared with the formula (15), it may be found that the inverleaved results obtained by adopting two different methods by the transmitting end are the same.

Similarly, the de-inverleaved results obtained by adopting two different methods by the receiving end are the same, so it is not described in detail here.

Figure 7:
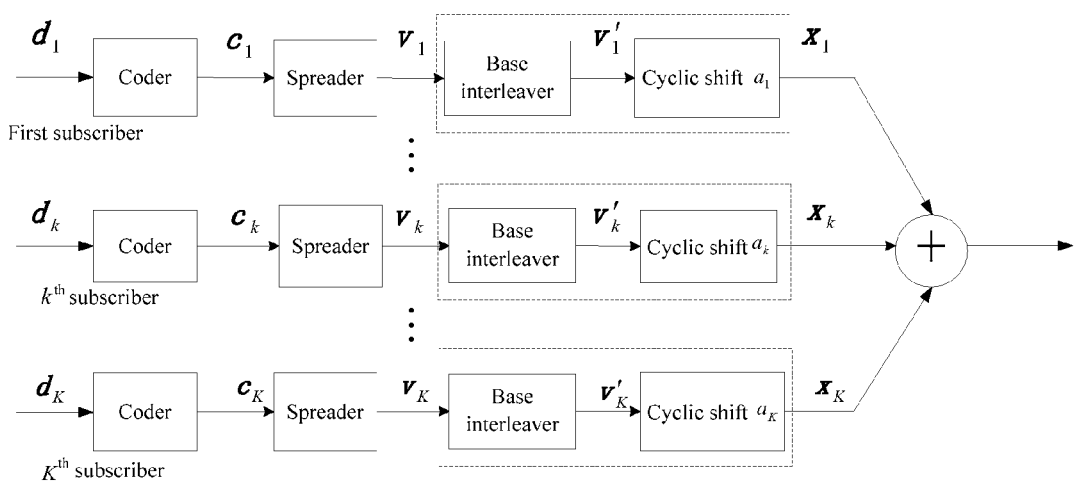
FIG. 7 is a schematic view one of a sending device of the IDMA system according to the embodiment of the present invention.

When the interleaving and the de-interleaving methods shown in FIG. 5 of the embodiment of the present invention are applied in the IDMA system, the sending device, i.e., the transmitting end may be as shown in FIG. 7. The interleaver in FIG. 7 is the base interleaver in the embodiment of the present invention $d_k = \{d_{k,0}, d_{k,1}, \ldots\}$ represents a source data frame of the $k^{th}$ subscriber. $C_k = \{C_{k,0}, C_{k,1}, \ldots\}$ represents a code word of the source data frame of the $k^{th}$ subscriber after being coded by a coder. $V_k = \{v_{k,0}, v_{k,1}, \ldots, v_{k,L-1}\}$ represents a spreading code of the code word of the $k^{th}$ subscriber after being spread by a spreader, the length of the spreading code is L, and the spreading code is usually called the chip. After being output from the base interleaver, the cycle shift needs to be performed on the spreading code after being spread. Definitely, the sending device in FIG. 7 is only a detailed application example, the receiving device in the IDMA system may not adopt the sending device as shown in FIG. 7, as long as the base interleaver is adopted in the sending device, or the method for performing the cyclic shift on the data frame output from the base interleaver is adopted, it is within the protection scope of the present invention. The sending device may also not be limited to be applied in the IDMA system.

Figure 8:
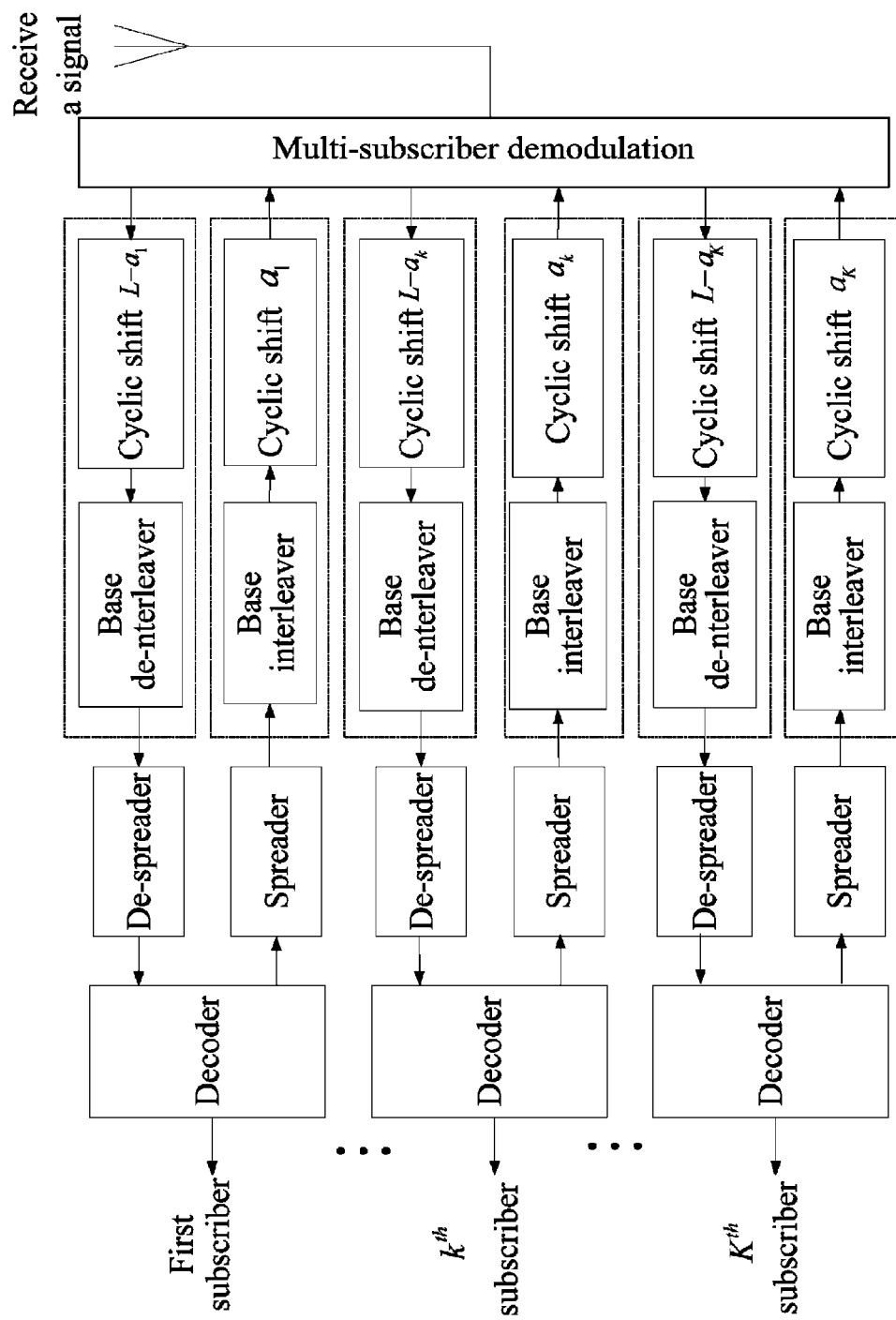
FIG. 8 is a schematic view one of a receiving device of the IDMA system according to the embodiment of the present invention.

When the interleaving and the de-interleaving methods as shown in FIG. 5 of the embodiment of the present invention are applied in the IDMA system, the receiving device, that is, the receiving end may be as shown in FIG. 8. The interleaver and the de-interleaver in FIG. 8 are the base interleaver and the base de-interleaver provided in the embodiment of the present invention, the data frame may be input to the base interleaver after the cyclic shift, and the cyclic shift may be performed on the data frame output from the base de-interleaver. Definitely, the receiving device of FIG. 8 is only a detailed application example, the receiving device in the IDMA system may not adopt the receiving device as shown in FIG. 8, as long as the base interleaver and the base de-interleaver are adopted in the receiving device, or the method for performing the cyclic shift on the data frame output from the base interleaver and the method for performing the cyclic shift on the data frame input to the base de-interleaver are adopted, it is within the protection scope of the present invention. The receiving device may also not be limited to be applied in the IDMA system.

Figure 9:
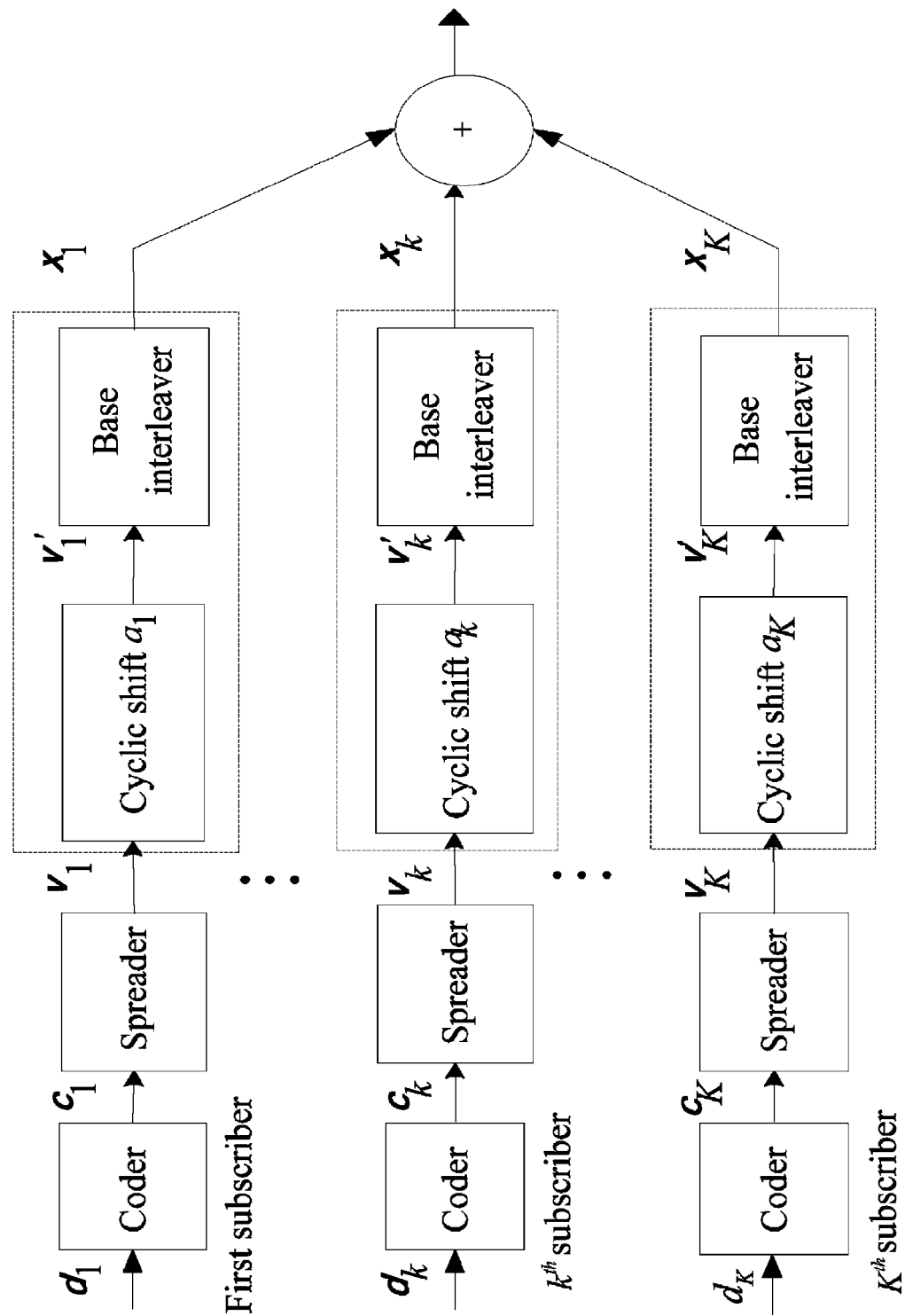
FIG. 9 is a schematic view two of the sending device of the IDMA system according to the embodiment of the present invention.

When the interleaving and the de-interleaving methods as shown in FIG. 6 of the embodiment the present invention are applied in the IDMA system, the sending device, that is, the transmitting end may be as shown in FIG. 9. The interleaver in FIG. 9 is the base interleaver provided in the embodiment of the present invention, $d_k = \{d_{k,0}, d_{k,1}, \ldots\}$ represents the source data frame of the $k^{th}$ subscriber. $C_k = \{C_{k,0}, C_{k,1}, \ldots\}$ represents the code word after being coded by the coder of the source data frame of the $k^{th}$ subscriber. $V_k = \{v_{k,0}, v_{k,1}, \ldots, v_{k,L-1}\}$ represents the spreading code of the code word of the $k^{th}$ subscriber after being spread by the spreader, the length of the spreading code is L, and the spread code is usually called the chip. The spreading code after being spread needs to be input to the base interleaver after the cyclic shift. Definitely, the sending device in FIG. 9 is only a detailed application example, the receiving device in the IDMA system may not adopt the sending device as shown in FIG. 9, as long as the base interleaver is adopted in the sending device, or the method for performing the cyclic shift on the data frame input to the base interleaver is adopted, it is within the protection scope of the present invention. The sending device may also not be limited to be applied in the IDMA system.

Figure 10:
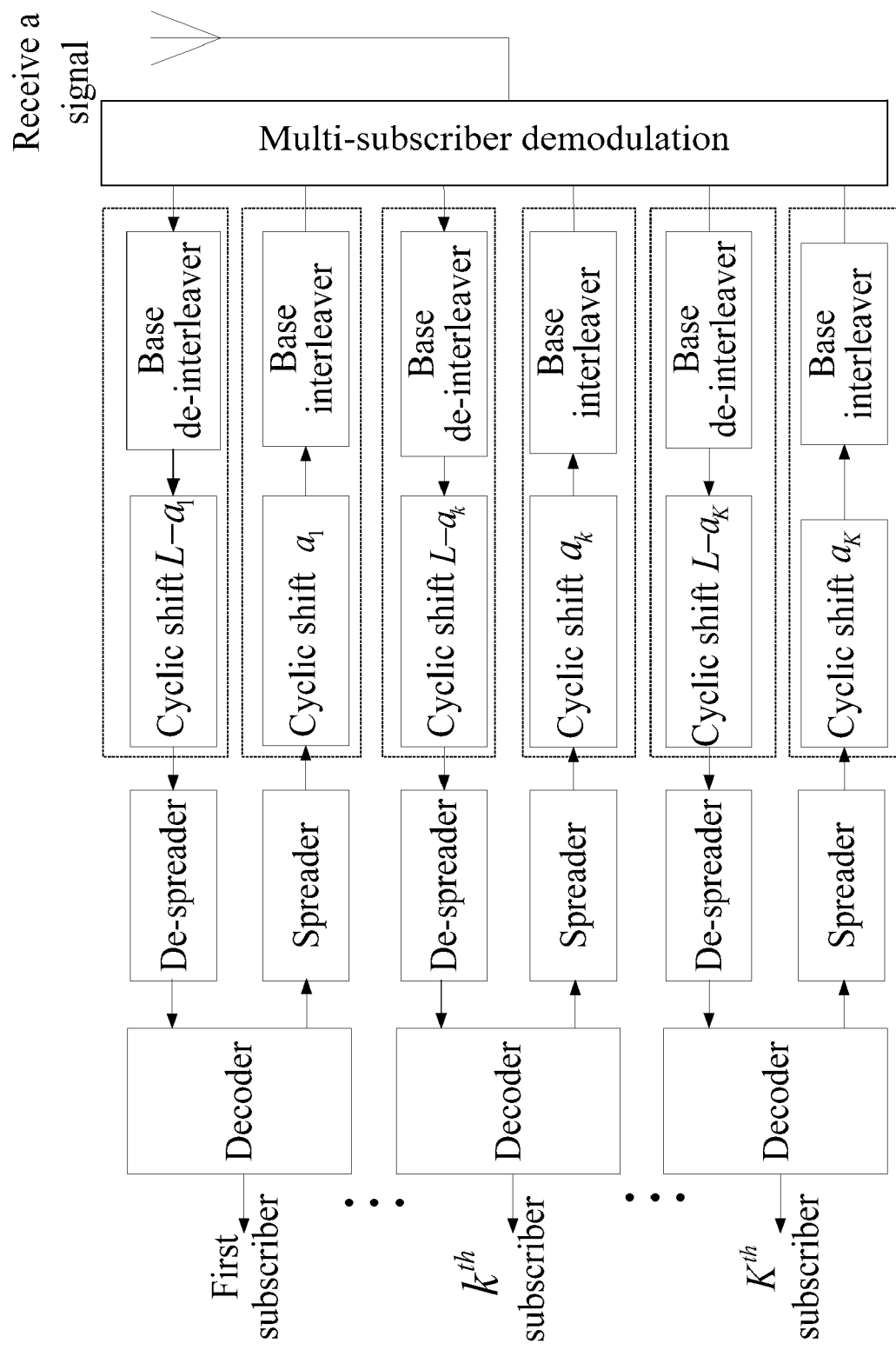
FIG. 10 is a schematic view two of the receiving device of the IDMA system according to the embodiment of the present invention.

When the interleaving and the de-interleaving methods as shown in FIG. 6 of the embodiment of the present invention are applied in the IDMA system, the receiving device, that is, the receiving end may be as shown in FIG. 10. The interleaver and the de-interleaver in FIG. 10 is the base interleaver and the base de-interleaver provided in the embodiment of the present invention, the data frame needs to be input to the base interleaver after the cyclic shift, and the data frame output from the base de-interleaver needs to be performed the cyclic shift. Definitely, the receiving device in FIG. 10 is only a detailed application example, the receiving device in the IDMA system may not adopt the receiving device as shown in FIG. 10, as long as the base interleaver and the base de-interleaver are adopted in the receiving device, or the method for performing the cyclic shift on the data frame input to the base interleaver and the method for performing the cyclic shift on the data frame output from the base de-interleaver are adopted, it is within the protection scope of the present invention. The receiving device may also not be limited to be applied in the IDMA system.

There are a plurality of applications of the embodiment of the present invention in the IDMA wireless communication system, for example, base stations in the controlling scope of one station controller may be grouped, one or more stations are grouped as a group, and one base interleaver and one base de-interleaver are designed for each group. Different groups have different base interleavers, the interleavers and the de-interleavers of all the subscribers in the base stations of each group are generated by performing the shift transform on the base interleaver. Definitely, the method of grouping the base stations is not limited to the above-mentioned manner, for example, several base controllers may be defined as one group, and one base interleaver and one base de-interleaver are designed for the group, or all the base stations controlled by one mobile switching center may be defined as one group, and one base interleaver and one base de-interleaver are designed for the group. Further, a plurality of base interleavers may be designed in one base station, the interleavers and the base de-interleavers of the different subscribers in the base station may be generated by performing the cyclic shift on the assigned base interleaver and base de-interleaver in the system. Definitely, the embodiment of the present invention is not only applicable at the above situation, as long as the interleavers of the subscribers are generated by performing the shift on the interleaving information of one interleaver, which is within the protection scope of the present invention.

The wireless communication system of the embodiment of the present invention includes a transmitting end device and a receiving end device. There is a generating interleaver apparatus set in the transmitting end device, and there is a generating de-interleaver apparatus set in the receiving end device. When the receiving end needs the interleaver and the de-interleaver at the same time, there are the generating interleaver apparatus and the generating de-interleaver apparatus set in the receiving end device at the same time. The generating interleaver apparatuses including a first storage module and a generating interleaver module, and the generating de-interleaver apparatus includes a second storage module and a generating de-interleaver module.

The first storage module is mainly adapted to store the interleaving information of the base interleaver. Here, the interleaving information may be the vector π of the base interleaver, and may also be the matrix of the base interleaver. The detailed description may be obtained with reference to the description of the above method.

The generating interleaver module is mainly adapted to obtain the interleaving information of the base interleaver from the first storage module, perform the cyclic shift on the interleaving information and generate the interleavers required by the transmitting end or receiving end, in which the generated interleavers are different. Here, the cyclic shift may be the row shift and/or the column shift performed on the base interleaving matrix. When the generating interleaver module performs the cyclic shift process on the interleaving information, the formulas described in the embodiment of the method may be adopted, so it is not described here.

The second storage module is mainly adapted to store the de-interleaving information of the base de-interleaver. Similarly, here the de-interleaving information of the base de-intedeaver may be the vector $\pi^{-1}$, or may be in the matrix form. During the practical application, if the interleaving information and the de-interleaving information are stored in the vector form, the occupied storage space is relatively small. A certain relationship exists between the interleaver and the de-interleaver, so the second storage module may also store the interleaving information of the base interleaver, the generating de-interleaver module may deduce the required de-interleaving information of the base de-interleaver according to the interleaving information of the base interleaver. The detailed description may be obtained with reference to the description of the above method.

The generating de-interleaver module is mainly adapted to obtain the de-interleaving information of the base de-interleaver from the second storage module, perform the cyclic shift on the de-interleaving information and generate the de-interleavers required by the receiving end, in which the generated de-interleavers are different. Here, the cyclic shift may be the row shift and/or the column shift performed on the base de-interleaving matrix. When the generating de-interleaver module performs the cyclic shift process on the de-interleaving information, the formulas described in the embodiment of the method may be adopted, so here it is not described here. The detailed description may be obtained with reference to the description of the above method.

When the system is the IDMA system, and the IDMA system requires the interleaving process and the de-interleaving process, in addition to the generating interleaver apparatus, there is an interleaving module set in the transmitting end device, and in addition to the generating de-interleaver apparatus, there is a de-interleaving module set in the receiving end device. When the receiving end device requires performing the interleaving process, there are the generating interleaver apparatus, the interleaving module, the generating de-interleaver apparatus and the de-interleaving module set in the receiving end device, The generating interleaver apparatus includes the first storage module and the generating interleaver module, the first storage module and the generating interleaver module are as described in the above embodiment, but the interleavers generated by the generating interleaver module are used to differentiate different subscribers, and are not described in detail here.

The interleaving module in the transmitting end or receiving end device is mainly adapted to input the data frame of each subscriber needed to be interleaved to the corresponding interleaver, here the interleaver is generated by the generating interleaver module. For example, the interleaving module inputs the spreading chip corresponding to each subscriber to the corresponding interleaver generated by the generating interleaver module to realize interleaving. The detailed description may be obtained with reference to the description of the above method.

The generating de-interleaver apparatus includes the second storage module and the generating de-interleaver module, and the second storage module and the generating de-interleaver module are as described in the above embodiment, but the de-interleavers generated by the generating de-interleaver module are used to differentiate different subscribers, and are not described in detail here.

The de-interleaving module is mainly adapted to input the interleaved data frame received by the receiving end to the corresponding de-interleaver, to realize de-interleaving. The detailed description may be obtained with reference to the description of the above method.

The embodiment of the present invention further provides one IDMA system, which includes a transmitting end device and a receiving end device. There is a base interleaver and a first shifting module set in the transmitting end device, and there is a base de-interleaver and a second shifting module set in the receiving end device. When the receiving end device requires performing the interleaving process, there is the base interleaver, the first shifting module, the base de-interleaver and the second shifting module set in the receiving end device. The system only requires storing the interleaving information of one base interleaver and the de-interleaving information of one base de-interleaver.

The data frame corresponding to each subscriber needed to be interleaved is input to the base interleaver, and the first shifting module performs the cyclic shift on the data frame output from the base interleaver and outputs the data frame after the cyclic shift to realize the interleaving process. The digits of the cyclic shifts performed on the data frames of the different subscribers output from the base interleaver and performed by the first shifting module are different. For the detailed realizing process, please refer to the description of the embodiment of above method. When the transmitting end device realizes the interleaving process by firstly inputting to the base interleaver and then performing the cyclic shift, the process of realizing de-interleaving by the receiving end device is as follows.

The second shifting module performs the cyclic shift operation on the data frame to be de-interleaved firstly, and the digits of the cyclic shifts performed on the data frames of the different subscribers needed to be de-interleaved by the second shifting module are different. The digits of the cyclic shifts performed on the data frames corresponding to the different subscribers needed to be de-interleaved by the second shifting module should be corresponding to the digits of the cyclic shifts performed by the first shifting module. The data frame after the cyclic shift and output by the second shifting module is input to the base de-interleaver, and the base de-interleaver performs the de-interleaving process on the received data frame and outputs the data frame. The detailed description may be obtained with reference to the description of the above method.

In addition to the above realizing process, the first shifting module, the base interleaver, the second shifting module and the base de-interleaver may adopt the realizing process as follows.

The first shifting module inputs the data frame corresponding to each subscriber needed to be interleaved to the base interleaver after performing the cyclic shift. The base interleaver performs the interleaving process on the input data frame and outputs the interleaved data frame. The digits of the cyclic shifts performed on the data frames of the different subscribers by the first shifting module are different. The two results, namely, the result of performing the data frame of each subscriber after the shift to the base interleaver and performing the interleaving process, and the result of generating the interleaver of each subscriber by performing the cyclic shift on the interleaving information of the base interleaver and then inputting the data frame of each subscriber to the corresponding interleaver so as to perform the interleaving process, are compared, it may be found that the effects are the same. The detailed description may be obtained with reference to the description of the above method.

The data frame needed to be de-interleaved is input to the base de-interleaver and is de-interleaved, the base de-interleaver transmits the de-interleaved data frame to the second shifting module, and the second shifting module performs the cyclic shift on the received data frame and outputs the data frame. The digits of the cyclic shifts performed on the de-interleaved data frames of the different subscribers by the second shifting module are different. The two results, namely, the result of performing the cyclic shift on the de-interleaved data frame input to the base de-interleaver of each subscriber and performing the de-interleaving process, and the result generating the de-interleaver of each subscriber by performing the cyclic shift on the de-interleaving information of the base de-interleaver and then inputting the data frame of each subscriber to the corresponding de-interleaver so as to perform the de-interleaving process, are compared, it may be found that the effects are the same. The detailed description may be obtained with reference to the description of the above method.

In the above embodiment, the description is given by using the IDMA system as an example, in practice, the methods for generating the interleaver and the de-interleaver in the embodiment of the present invention may be further applicable to other systems requiring a plurality of interleavers and a plurality of de-interleavers, such as a trellis-code multiple-access (TCMA). The principle of the TCMA may be obtained with reference to "Iterative Detectors for Trellis-Code Multiple-Access" in "IEEE TRANSACTIONS ON COMMUNICATIONS, VOL. 50, NO. 9, SEPT. 2002" by Fredrik Brännström, Tor M. Aulin, and Lars K. Rasmussen in Sept. of 2002.

It may be known from the above embodiment that the method for designing the interleaver for each subscriber in the present invention is relatively simple, that is, only one base interleaver is required, the interleavers of other subscribers may be obtained by performing the simple cyclic shift transform on the base interleaver. In the embodiment of the present invention, other interleavers and de-interleavers are obtained by performing the cyclic shift on the base interleaver and the base de-interleaver, so it is only necessary for the system to store the interleaving information of the base interleaver and the de-interleaving information of the base de-interleaver, so as to prevent the problem in the prior art one that a great amount of the memory resource is occupied, thereby saving a large portion of the system memory. The methods for generating the interleaver and the de-interleaver in the present invention are simple, so as to avoid the time delay during the interleaving and the de-interleaving processes in the prior art two and reduce the system complexity. The interleaving and the de-interleaving processes performed by adopting the interleaver and the de-interleaver designed according to the embodiment of the present invention may achieve system performances, such as bit error rate, in the solution of the prior art.

Finally, it should be understood that the above embodiments are only used to explain, but not to limit the technical solution of the present invention. In despite of the detailed description of the present invention with referring to above preferred embodiments, it should be understood that various modifications, changes or equivalent replacements can be made by those skilled in the art without departing from the spirit and scope of the present invention and covered in the claims of the present invention.

What is claimed is:

1. A method, implemented by a network device, for generating an interleaver, comprising:
Performing a cyclic shift comprising at least one of the following: a row cyclic shift performed on a base interleaving matrix and a column cyclic shift performed on a base interleaving matrix;
performing a modulo operation on a base interleaving vector;
generating a $k^{th}$ interleaver by the column cyclic shift performed on the base interleaving matrix, that is, by the modulo operation performed on the base interleaving vector is $\pi_k(i)=(\pi(i)+a_k)\% L$; and
generating a $k^{th}$ interleaver by the row cyclic shift performed on the base interleaving matrix, that is, by the modulo operation performed on the base interleaving vector is $\pi_k(i)=\pi((i+a_k)\% L)$;
wherein a size of the base interleaving matrix is set to be L×L, L is a size of an interleaving matrix, K is a number of subscribers, k is a number within 1 to K, i=0,1, . . . , L−1, $a_k$ is any number not smaller than 0, and the $a_k$ of different interleavers are different from results of performing the modulo operation on L.

2. The method for generating the interleaver according to claim 1, wherein the $a_k$ corresponding to the $k^{th}$ interleaver is $$a_k = \left\lfloor \frac{L}{K} \right\rfloor k.$$

3. A method, implemented by a network device for generating a de-interleaver, comprising:
generating de-interleaving information; and
performing a cyclic shift corresponding to an interleaving information cyclic shift on the de-interleaving information saved in a system memory resource so as to generate a plurality of de-interleavers.

4. The method for generating de-interleaver according to claim 3, wherein the cyclic shift comprises at least one of the following: a row cyclic shift or a column cyclic shift performed on a base interleaving matrix, and a modulo operation performed on a base interleaving vector.

5. The method of claim 3 wherein generating the de-interleaver information includes getting interleaving information of a base interleaver and deducing from the interleaving information to obtain the de-interleaving information of a base de-interleaver.

6. A network device, which is a transmitting end device, comprising:
a generating interleaver apparatus;
wherein the generating interleaver apparatus comprises a first storage module configured to store interleaving information of a base interleaver and a generating interleaver module configured to obtain the interleaving information of the base interleaver from the first storage module and perform a cyclic shift on the interleaving information to generate an corresponding interleaver for each subscriber where different subscribers correspond to different cyclic shifts.

7. The network device according to claim 6, further comprising:
an interleaving module, wherein
the interleaving module is configured to input a data frame of each of the subscribers needed to be interleaved to the corresponding interleaver generated by the generating interleaver module to realize interleaving.

8. A network device, which is a receiving end device, comprises at least one of the following: a generating de-interleaver apparatus, and a generating interleaver apparatus and a generating de-interleaver apparatus; wherein
the generating interleaver apparatus comprises a first storage module and a generating interleaver module;
the first storage module is configured to store interleaving information of a base interleaver;
the generating interleaver module is configured to obtain the interleaving information of the base interleaver from the first storage module and perform a cyclic shift on the interleaving information to generate an corresponding interleaver for each subscriber, wherein different subscribers correspond to different cyclic shifts;
the generating de-interleaver apparatus comprises a second storage module and a generating de-interleaver module;
the second storage module is configured to store de-interleaving information of a base de-interleaver; and the generating de-interleaver module is configured to obtain the de-interleaving information of the base de-interleaver from the second storage module and perform the cyclic shift on the de-interleaving information to generate a corresponding de-interleaver for each of the subscriber, wherein the different subscribers correspond to different cyclic shifts.

9. The network device according to claim 8, further comprises a de-interleaving module and wherein the interleaving module is configured to input a data frame needed to be interleaved to the corresponding interleaver generated by the generating interleaver module to realize interleaving; and the de-interleaving module is configured to input another data frame needed to be interleaved to the corresponding de-interleaver so as to realize interleaving.

* * * * *